(12) United States Patent
Nakajima

(10) Patent No.: US 8,373,288 B2
(45) Date of Patent: Feb. 12, 2013

(54) ALIGNMENT MARK, METHOD OF MANUFACTURING SEMICONDUCTOR DEVICE, AND MASK SET

(75) Inventor: Hiroomi Nakajima, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 328 days.

(21) Appl. No.: 12/726,697

(22) Filed: Mar. 18, 2010

(65) Prior Publication Data

US 2010/0240192 A1    Sep. 23, 2010

(30) Foreign Application Priority Data

Mar. 23, 2009 (JP) .................... 2009-070743

(51) Int. Cl.
*H01L 23/544* (2006.01)
(52) U.S. Cl. ............................... 257/797; 257/E23.179
(58) Field of Classification Search .................. 257/797, 257/E23.179
See application file for complete search history.

(56) References Cited

U.S. PATENT DOCUMENTS 6,034,882 A   3/2000  Johnson et al.
6,218,263 B1  4/2001  Chung et al.

FOREIGN PATENT DOCUMENTS

| JP | 2-142110 | 5/1990 |
|---|---|---|
| JP | 2-158120 | 6/1990 |
| JP | 3-191509 | 8/1991 |
| JP | 9-232207 | 9/1997 |
| JP | 10-209015 | 8/1998 |
| JP | 2000-12431 | 1/2000 |
| JP | 2007-201481 | 8/2007 |
| JP | 2008-537642 | 9/2008 |
| WO | WO 2006/011715 A1 | 2/2006 |

OTHER PUBLICATIONS

Office Action issued Aug. 23, 2011 in Japan Application No. 2009-070743 (With English Translation).

*Primary Examiner* — Zandra Smith
*Assistant Examiner* — Toniae Thomas
(74) *Attorney, Agent, or Firm* — Oblon, Spivak, McClelland, Maier & Neustadt, L.L.P.

(57) ABSTRACT

An alignment mark formed by using a first mask used in forming a same memory cell pattern on a substrate and formed together with the memory cell pattern includes: a first pattern for position detection used for alignment in forming a first wiring pattern; and a first irregular reflection prevention mark that suppresses, when a position detection signal is irradiated as alignment in forming a second wiring pattern further on an upper layer side than the first wiring pattern, irregular reflection of a position detection signal from a second pattern for position detection formed further in a lower layer than the first pattern for position detection.

13 Claims, 4 Drawing Sheets

ALIGNMENT MARK, METHOD OF MANUFACTURING SEMICONDUCTOR DEVICE, AND MASK SET

CROSS-REFERENCE TO RELATED APPLICATIONS

This application is based upon and claims the benefit of priority from the prior Japanese Patent Application No. 2009-70743, filed on Mar. 23, 2009; the entire contents of which are incorporated herein by reference.

BACKGROUND OF THE INVENTION

1. Field of the Invention

The present invention relates to an alignment mark, a method of manufacturing a semiconductor device, and a mask set.

2. Description of the Related Art

A stacked cross-point memory such as a resistance random access memory (ReRAM) is configured by stacking memory cells having the same pattern a plurality of times. When such a stacked cross-point memory is manufactured, alignment marks are formed in respective layers in advance. When a pattern in an upper layer side is formed, mask alignment (alignment of the upper layer with the lower layer) is performed by using an alignment mark formed in a pattern on a lower layer side.

When it is attempted to stack memory cells of the stacked cross-point memory using only one mask set, the same mask is used a plurality of times. Therefore, a memory cell pattern on the upper layer side is stacked on a memory cell pattern on the lower layer side. The alignment mark on the upper layer side is also stacked on the alignment mark on the lower layer side. Therefore, after memory cells of two or more layers are formed, when a word line and a bit line are aligned with a memory cell of an uppermost layer, an alignment mark formed in a memory cell is present in a lower layer side of an alignment mark of the uppermost layer. When position detection signals for detecting the positions of the alignment marks is irradiated, the position detection signals interfere with each other in the alignment mark on the upper layer side and the alignment mark on the lower layer side. This makes it difficult to accurately detect the positions of the alignment marks. In this way, in the stacked cross-point memory, although the memory cells in the respective layers are the same pattern, the memory cells cannot be stacked with only one mask set.

Therefore, even if internal data of memory cell patterns are the same, to align memory cells, it is necessary to prepare mask sets of memory cells equivalent to the number of stacks having different arrangements of alignment marks. Respective masks of the memory cells equivalent to the number of stacks are masks having the same data of the memory cells and different arrangements of alignment marks (see, for example, Japanese Patent Application Laid-Open No. H2-158120).

However, in the method disclosed in Japanese Patent Application Laid-Open No. H2-158120, it is necessary to manufacture mask sets of memory cells equivalent to the number of stacks. Therefore, a large number of masks are used to form the memory cells and high cost is required to manufacture and maintain the mask sets.

BRIEF SUMMARY OF THE INVENTION

An alignment mark according to an embodiment of the present invention formed by using a first mask used in forming a same memory cell pattern on a substrate and formed together with the memory cell pattern, the alignment mark comprises: a first pattern for position detection used for alignment in forming a first wiring pattern; and a first irregular reflection prevention mark that suppresses, when a position detection signal is irradiated as alignment in forming a second wiring pattern further on an upper layer side than the first wiring pattern, irregular reflection of a position detection signal from a second pattern for position detection such that the irradiated position detection signal is not affected by the second pattern for position detection formed by a second mask, which has a memory cell pattern same as that of the first mask and is different from the first mask, and used for alignment in forming a third wiring pattern further on a lower layer side than the first wiring pattern.

A method of manufacturing a semiconductor device by forming a same memory cell pattern on a substrate, according to an embodiment of the present invention comprises: in forming a memory cell pattern using a first mask and a second mask used in forming the same memory cell pattern on the substrate: forming a pattern corresponding to a first irregular reflection prevention mark, the memory cell pattern, and a first pattern for position detection using the first mask including a first mask pattern and the first irregular reflection prevention mark, the first mask pattern forming, on the substrate, the first pattern for position detection used for alignment in forming a first wiring pattern, and the first irregular reflection prevention mark suppressing, when a position detection signal is irradiated as alignment in forming a second wiring pattern further on an upper layer side than the first wiring pattern using the second mask, irregular reflection of a position detection signal from the second pattern for position detection such that the irradiated position detection signal is not affected by the second pattern for position detection formed by the second mask and used for alignment in forming a third wiring pattern further on a lower layer side than the first wiring pattern; forming a pattern corresponding to a second irregular reflection prevention mark, the memory cell pattern, and a second pattern for position detection using the second mask including a second mask pattern and the second irregular reflection prevention mark, the second mask pattern forming, on the substrate, the second pattern for position detection, and the second irregular reflection prevention mark suppressing, when a position detection signal is irradiated as alignment in forming a fourth wiring pattern further on the upper layer side than the second wiring pattern using the first mask, irregular reflection of a position detection signal from the first pattern for position detection such that the irradiated position detection signal is not affected by the first pattern for position detection formed by the first mask and used for alignment in forming the first wiring pattern; and forming a pattern corresponding to the first irregular reflection prevention pattern, the memory cell pattern, and the first pattern for position detection using the first mask.

A mask set according to an embodiment of the present invention comprises: first and second masks used in forming a same memory cell pattern on a substrate, wherein the first mask includes: a first mask pattern that forms, on the substrate, a first pattern for position detection used for alignment in forming a first wiring pattern; and a first irregular reflection prevention mark that suppresses, when a position detection signal is irradiated as alignment in forming a second wiring pattern further on an upper layer side than the first wiring pattern, irregular reflection of a position detection signal from a second pattern for position detection such that the irradiated position detection signal is not affected by the second pattern for position detection formed by a second mask and used for alignment in forming a third wiring pattern further on a lower layer side than the first wiring pattern, and the second mask includes: a second mask pattern that forms the second pattern for position detection; and a second irregular reflection prevention mark that suppresses, when a position detection signal is irradiated as alignment in forming a fourth wiring pattern further on the upper layer side than the second wiring pattern using the first mask, irregular reflection of a position detection signal from the first pattern for position detection such that the irradiated position detection signal is not affected by the first pattern for position detection formed by the second mask and used for alignment in forming the first wiring pattern.

DETAILED DESCRIPTION OF THE INVENTION

Exemplary embodiments of the present invention are explained in detail below with reference to the accompanying drawings. The present invention is not limited by the embodiments. In the following explanation, the structure of a memory section (a stacked memory cell) of a stacked cross-point memory such as a ReRAM is explained and then alignment marks used for forming memory cells are explained.

Figure 1:
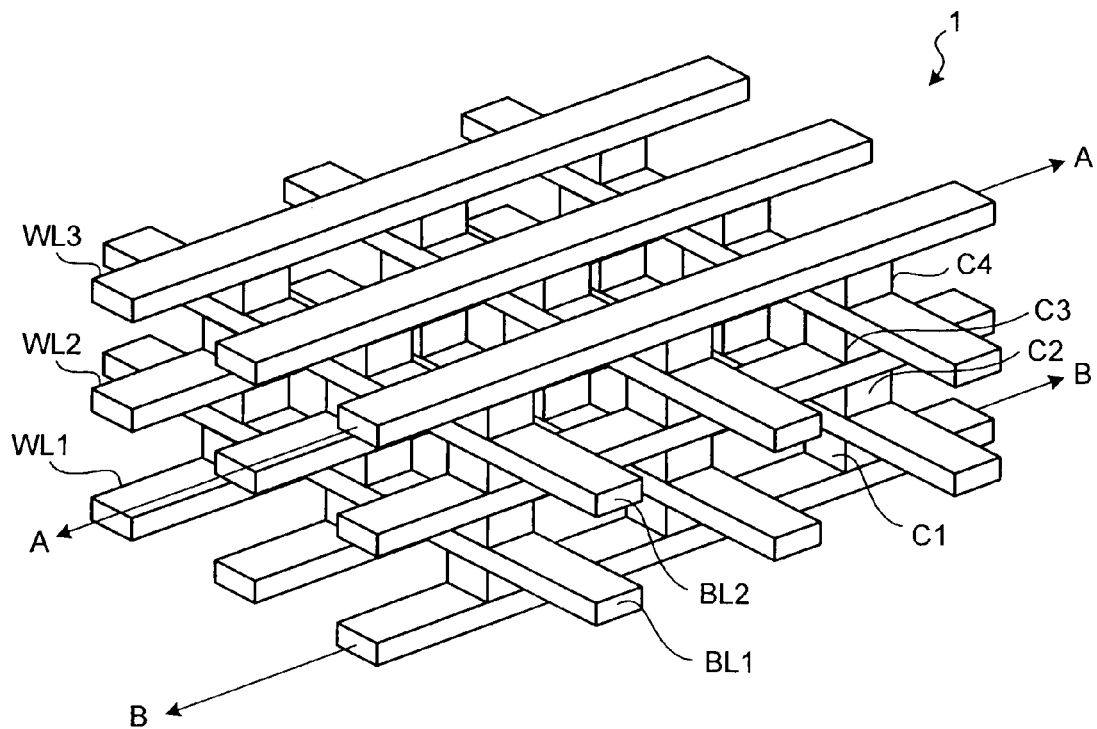
FIG. 1 is a perspective view of a configuration example of a stacked memory cell formed in a stacked cross-point memory.
Figure 2:
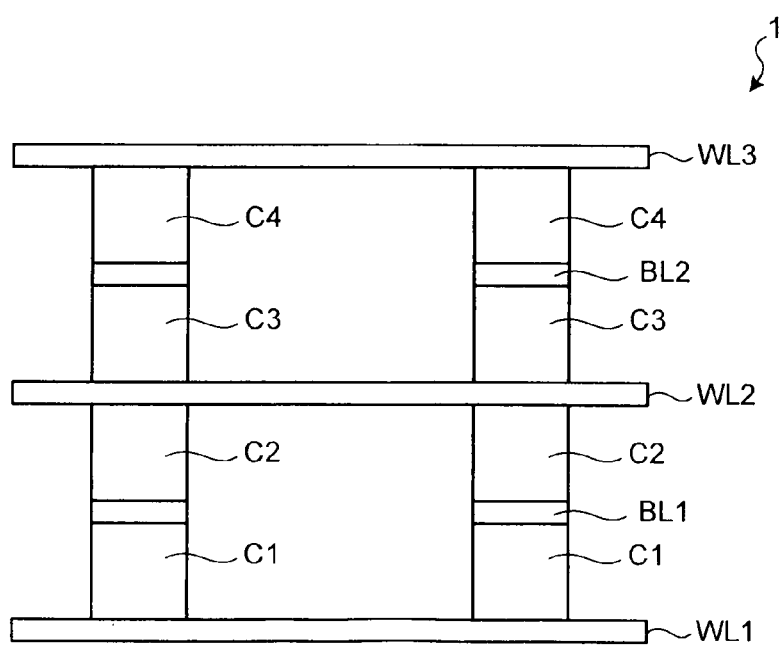
FIG. 2 is a sectional view of the configuration example of the stacked memory cell formed in the stacked cross-point memory.

FIG. 1 is a perspective view of a configuration example of a stacked memory cell formed in a stacked cross-point memory according to a first embodiment of the present invention. FIG. 2 is a sectional view of the configuration example of the stacked memory cell formed in the stacked cross-point memory. In FIG. 2, a sectional view of a stacked memory cell 1 taken along a plane including a line A-A and a line B-B is shown. In FIGS. 1 and 2, inter layer dielectrics (ILD) is not shown.

The stacked memory cell (a semiconductor storage device) 1 is configured by stacking a plurality of layers. Specifically, in the stacked memory cell 1, word lines WL1, memory cells C1, bit lines BL1 (third wiring patterns), memory cells C2, word lines WL2 (first wiring patterns), memory cells C3, bit lines BL2 (second wiring patterns), memory cells C4, and word lines WL3 (fourth wiring patterns) are stacked in this order from a lower layer side.

A plurality of the word lines WL1 are arranged in parallel to one another at predetermined intervals to face a coaxial direction in a predetermined plane (a lowermost layer surface of the stacked memory cell 1). A plurality of the word lines WL2 are arranged in parallel to one another at predetermined intervals to face the coaxial direction in a predetermined plane on a side higher than the word lines WL1. A plurality of the word lines WL3 are arranged in parallel to one another at predetermined intervals to face the coaxial direction in a predetermined plane on a side higher than the word lines WL2. When the stacked memory cell 1 is viewed from the upper surface side, the word lines WL1 to WL3 face the coaxial direction and overlap one another.

A plurality of the bit lines BL1 are arranged in parallel to one another at predetermined intervals to face a coaxial direction in a predetermined plane. A plurality of bit lines BL2 are arranged in parallel to one another at predetermined intervals to face the coaxial direction in a predetermined plane on a side higher than the bit lines BL1. When the stacked memory cell 1 is viewed from the upper surface side, the bit lines BL1 and BL2 face the coaxial direction and overlap each other. When the stacked memory cell 1 is viewed from the upper surface side, the bit lines BL1 and BL2 are formed to be orthogonal to the word lines WL1 to WL3.

The memory cells C1 are formed between the word lines WL1 and the bit lines BL1. Specifically, when the stacked memory cell 1 is viewed from the upper surface side, the memory cells C1 are formed to be held between the word lines WL1 and the bit lines BL1 in positions where the word lines WL1 and the bit lines BL1 overlap each other.

The memory cells C2 are formed between the bit lines BL1 and the word lines WL2. Specifically, when the stacked memory cell 1 is viewed from the upper surface side, the memory cells C2 are formed to be held between the bit lines BL1 and the word lines WL2 in positions where the bit lines BL1 and the word lines WL2 overlap each other.

The memory cells C3 are formed between the word lines WL2 and the bit lines BL2. Specifically, when the stacked memory cell 1 is viewed from the upper surface side, the memory cells C3 are formed to be held between the word lines WL2 and the bit lines BL2 in positions where the word lines WL2 and the bit lines BL2 overlap each other.

The memory cells C4 are formed between the bit lines BL2 and the word lines WL3. Specifically, when the stacked memory cell 1 is viewed from the upper surface side, the memory cells C4 are formed to be held between the bit lines BL2 and the word lines WL3 in positions where the bit lines BL2 and the word lines WL3 overlap each other.

Figure 3:
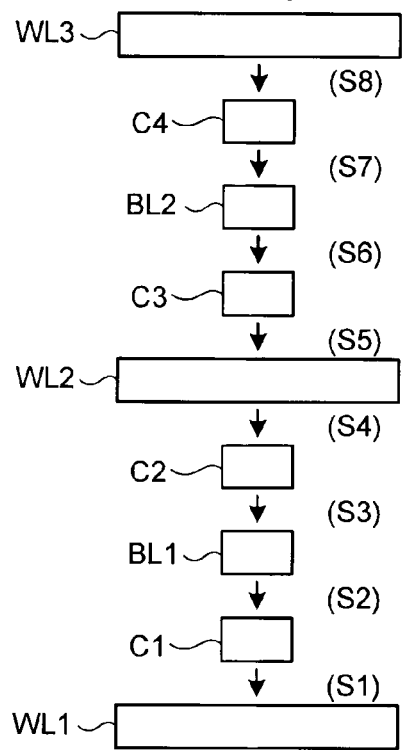
FIG. 3 is a diagram for explaining a processing procedure for forming stacked memory cell.

FIG. 3 is a diagram for explaining a processing procedure for forming a stacked memory cell. The stacked memory cell 1 is formed on a semiconductor substrate (not shown) such as a wafer. As the semiconductor substrate (hereinafter, "substrate"), for example, P-type Si having relatively low density (about 1e15cm-3) is used. After a normal complementary metal oxide semiconductor (CMOS) process performed on a P-SUB and an Nwell, an oxide film planarization process is performed.

The word line WL1 in the first layer is formed on the upper layer surface of the planarized oxide film. Specifically, the word line WL1 is formed by depositing a word line material over the entire surface of the substrate and then patterning the word line material.

When the word line WL1 is formed, an alignment mark with the word line WL1 set as a master mark (an alignment destination) is formed of the word line material in advance together with the word line WL1. The master mark is a mark of the alignment destination (an alignment mark for a rendering mask) used in forming patterns in the next and subsequent processes. In other words, when the patterns are formed, the patterns are formed after being aligned with a predetermined master mark formed on a lower layer side. The master mark formed of the word line material (a member same as that of the word line WL1) is an alignment destination of the memory cell C1 when the memory cell C1 is formed.

Subsequently, a cell material in a first layer including a ReRAM material and a diode is deposited over the entire surface of the substrate. The cell material is left only in a part on the word line WL1 in the first layer. The left cell material forms the memory cell C1 in the first layer. When the memory cell C1 is formed (patterned), the memory cell C1 is aligned with the word line WL1 such that the memory cell C1 is formed in a position corresponding to the position of the word line WL1. Specifically, the memory cell C1 and the word line WL1 are aligned by using the alignment mark formed when the word line WL1 is patterned (S1).

When the memory cell C1 is formed, an alignment mark (an alignment mark Pa1 explained later) with the memory cell C1 set as a master mark is formed of a cell material (a member same as that of the memory cell C1) in advance together with a pattern of the memory cell C1. Further, in this embodiment, a solid pattern (a solid pattern Pa2 explained later) is formed of a member same as that of the memory cell C1 in a position different from the alignment mark Pa1. The solid pattern Pa2 is a pattern formed of solid data and is a pattern that can cover the entire surface of an alignment mark (an alignment mark Pb1 explained later) formed of a member same as that of the memory cell C2. A cell mask used in forming the memory cell C1, the alignment mark Pa1, and the solid pattern Pa2 is a first mask (a cell mask A explained later) used for forming the stacked memory cell 1. In this embodiment, memory cells (memory cell patterns) C1 to C4 are formed by using two kinds of cell masks, i.e., the cell mask A and a second cell mask (a cell mask B explained later) used for forming the stacked memory cell 1.

Figure 4A:
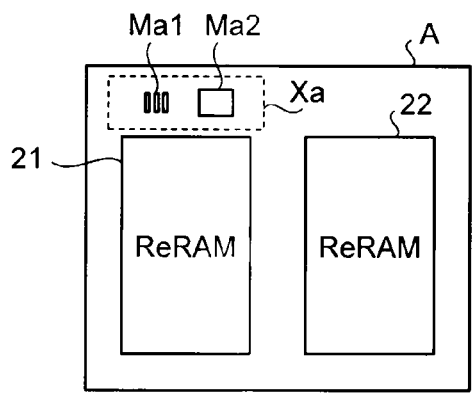
FIGS. 4A and 4B are diagrams of examples of cell masks used for forming memory cells.
Figure 4B:
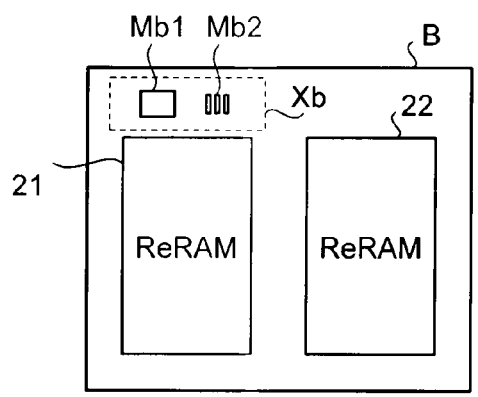
Figure 5A:
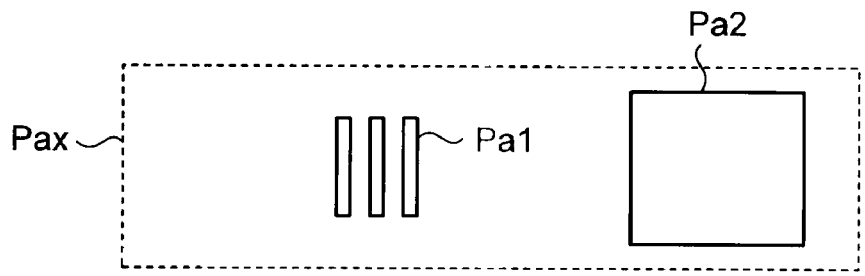
FIG. 5A and 5B are diagrams of examples of the configurations of alignment marks used for forming memory cells.
Figure 5B:
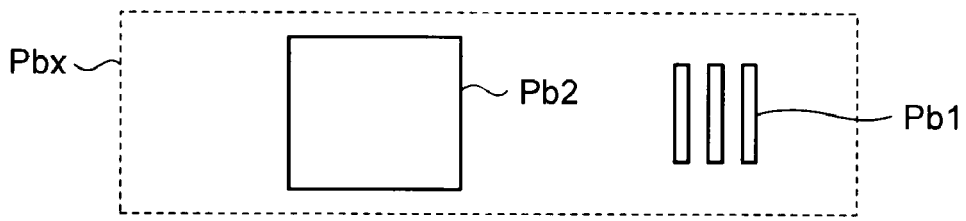

FIGS. 4A and 4B are diagrams of examples of cell masks used for forming memory cells. FIGS. 5A and 5B are diagrams of examples of the configurations of alignment marks used for forming memory cells. In FIGS. 4A and 4B, top views of cell masks used for forming the memory cells C1 to C4 are shown. In FIGS. 5A and 5B, top views of alignment marks and solid patterns formed on substrates are shown. In this embodiment, the cell mask (the second cell mask) A is used for forming the memory cells C1 and C3 and the cell mask (the first cell mask) B is used for forming the memory cells C2 and C4. As shown in FIGS. 4A and 4B, in the cell mask A and the cell mask B, call patterns (ReRAMs 21 and 22) of memory cells are the same and areas where alignment marks are formed (alignment mark forming areas Xa and Xb) are different. In this embodiment, the alignment mark forming area Xa is arranged in the cell mask A and the alignment mark forming area Xb is arranged in the cell mask B.

A mask pattern (a second mask pattern) Ma1 for forming the alignment mark (a second pattern for position detection) Pa1 and a mask pattern (a second irregular reflection preventing mark) Ma2 for forming the solid pattern Pa2 are arranged in the alignment mark forming area Xa.

A mask pattern (a first mask pattern) Mb1 for forming the alignment mark (a first pattern for position detection) Pb1 and a mask pattern (a first irregular reflection preventing mark) Mb2 for forming a solid pattern Pb2 are formed in the alignment mark forming area Xb.

When a pattern is formed on the substrate by using the cell mask A, as shown in FIG. 5A, an alignment mark group Pax as a pattern corresponding to the alignment mark forming area Xa. When a pattern is formed on the substrate by using the cell mask B, as shown in FIG. 5B, an alignment mark group Pbx is formed as a pattern corresponding to the alignment mark forming area Xb.

The alignment mark group Pax includes the alignment mark Pa1 corresponding to the mask pattern Ma1 and the solid pattern Pa2 corresponding to the mask pattern Ma2. The alignment mark group Pbx includes the alignment mark Pb1 corresponding to the mask pattern Mb1 and the solid pattern Pb2 corresponding to the mask pattern Mb2.

The alignment mark Pa1 and the alignment mark Pb1 are, for example, substantially bar-like patterns including a plurality of patterns. The substantially bar-line patterns are arranged in a direction parallel to a predetermined direction (e.g., the word line WL1 or the bit line BL1). The solid pattern Pa2 and the solid pattern Pb2 are, for example, a substantially tabular pattern and have a size enough for covering the entire surfaces of the alignment mark Pa1 and the alignment mark Pb1.

The cell masks A and B are formed such that the position of the mask pattern Ma1 on the cell mask A and the position of the mask pattern Mb2 on the cell mask B are the same. The cell masks A and B are formed such that the position of the mask pattern Mb1 on the cell mask B and the position of the mask pattern Ma1 on the cell mask A are the same.

Consequently, when a pattern is formed on the substrate by using the cell mask B after a pattern is formed on the substrate by using the cell mask A, the solid pattern Pb2 is formed on the alignment mark Pa1. The alignment mark Pb1 is formed on the solid pattern Pa2.

When a pattern is formed on the substrate by using the cell mask A after a pattern is formed on the substrate by using the cell mask B, the solid pattern Pa2 is formed on the alignment mark Pb1. The alignment mark Pa1 is formed on the solid pattern Pb2.

In this embodiment, memory cells are formed by alternately using the cell mask A and the cell mask B. Consequently, even when the alignment mark Pa1 is stacked on the substrate, the alignment mark Pa1 is stacked via the solid pattern Pb2. Even when the alignment mark Pb1 is stacked on the substrate, the alignment mark Pb1 is stacked via the solid pattern Pa2.

After the memory cell C1 is formed by the cell mask A, an oxide film is deposited over the entire surface of the substrate and a planarization process is performed. Consequently, an interlayer insulating film (an interlayer insulating film I1 explained later) is formed in an upper layer of the memory cell C1. Thereafter, the bit line BL1 in the first layer is formed on the upper layer surface of the planarized oxide film. Specifically, the bit line BL1 is formed by depositing a bit line material over the entire surface of the substrate and then patterning the bit line material. The bit line BL1 is formed to be orthogonal to the word line WL1 and joined to the memory cell C1.

When the bit line BL1 is formed, the bit line BL1 is aligned with the memory cell C1 such that the bit line BL1 is formed in a position corresponding to the position of the memory cell C1. Specifically, the bit line BL1 and the memory cell C1 are aligned by using the alignment mark Pa1 formed of a member same as that of the memory cell C1 (S2). Further, when the bit line BL1 is formed, an alignment mark with the bit line BL1 set as a master mark is formed of a bit line material (a member same as that of the bit line BL1) in advance together with a pattern of the bit line BL1.

Subsequently, a cell material in a second layer including a ReRAM material and a diode is deposited over the entire surface of the substrate. The cell material is left only in a part (a position same as the position of the memory cell C1) on the bit line BL1 in the first layer. The left cell material forms the memory cell C2 in the second layer. When the memory cell C2 is formed, the memory cell C2 is aligned with the bit line BL1 such that the memory cell C2 is formed in a position corresponding to the position of the bit line BL1. Specifically, the memory cell C2 and the bit line BL1 are aligned by using an alignment mark formed of a member same as that of the bit line BL1 (S3).

The memory cell C2 is formed by the cell mask B. When the memory cell C2 is formed, the alignment mark Pb1 with the memory cell C2 set as a master mark is formed together with a pattern of the memory cell C2. Further, when the memory cell C2 is formed, the solid pattern Pb2 that can cover the entire surface of the alignment mark Pa1 is formed. Consequently, the alignment mark Pb1 and the solid pattern Pb2 are formed on the substrate by using a member same as that of the memory cell C2.

After the memory cell C2 is formed by the cell mask B, an oxide film is deposited over the entire surface of the substrate and a planarization process is performed. Consequently, an interlayer insulating film (an interlayer insulating film 12 explained later) is formed in an upper layer of the memory cell C2. Thereafter, the word line WL2 in the second layer is formed on the upper layer surface of the planarized oxide film. Specifically, the word line WL2 is formed by depositing a word line material on the entire surface of the substrate and then patterning the word line material. The word line WL2 is formed on the word line WL1 and formed to be orthogonal to the bit line BL1 and joined to the memory cell C2.

When the word line WL2 is formed, the word line WL2 is aligned with the memory cell C2 such that the word line WL2 is formed in a position corresponding to the position of the memory cell C2. Specifically, the word line WL2 and the memory cell C2 are aligned by using the alignment mark Pb1 formed of a member same as that of the memory cell C2 (S4). Further, when the word line WL2 is formed, an alignment mark with the word line WL2 set as a master mark is formed of a member same as that of the word line WL2 in advance together with a pattern of the word line WL2.

Subsequently, a cell material in a third layer including a ReRAM material and a diode is deposited over the entire surface of the substrate and left only in a part (positions same as the position of the memory cells C1 and C2) on the word line WL2 in the second layer. The left cell material forms the memory cell C3 in the third layer. When the memory cell C3 is formed, the memory cell C3 is aligned with the word line WL2 such that the memory cell C3 is formed in a position corresponding to the position of the word line WL2. Specifically, the memory cell C3 and the word line WL2 are aligned by using an alignment mark formed of a member same as that of the word line WL2 (S5).

The memory cell C3 is formed by the cell mask A. When the memory cell C3 is formed, the alignment mark Pa1 with the memory cell C3 set as a master mark is formed together with a pattern of the memory cell C3. Further, when the memory cell C3 is formed, the solid pattern Pa2 that can cover the entire surface of the alignment mark Pb1 is formed. Consequently, the alignment mark Pa1 and the solid pattern Pa2 are formed on the substrate by using a member same as that of the memory cell C3.

After the memory cell C3 is formed by the cell mask A, an oxide film is deposited over the entire surface of the substrate and a planarization process is performed. Consequently, an interlayer insulating film (an interlayer insulating film I3 explained later) is formed in an upper layer of the memory cell C3. Thereafter, the bit line BL2 in the second layer is formed on the upper layer surface of the planarized oxide film. Specifically, the bit line BL2 is formed by depositing a bit line material over the entire surface of the substrate and then patterning the bit line material. The bit line BL2 is formed on the bit line BL1 and formed to be orthogonal to the word line WL2 and joined to the memory cell C3.

When the bit line BL2 is formed, the bit line BL2 is aligned with the memory cell C3 such that the bit line BL2 is formed in a position corresponding to the position of the memory cell C3. Specifically, the bit line BL2 and the memory cell C3 are aligned by using an alignment mark Pa1 formed of a member same as that of the memory cell C3 (S6). Further, when the bit line BL2 is formed, an alignment mark with the bit line BL2 set as a master mark is formed of a member same as that of the bit line BL2 together with a pattern of the bit line BL2.

Subsequently, a cell material in a fourth layer including a ReRAM material and a diode is deposited over the entire surface of the substrate and left only in a part (memory cells C1 to C3) on the bit line BL2 in the second layer. The left cell material forms the memory cell C4 in the second layer. When the memory cell C4 is formed, the memory cell C4 is aligned with the bit line BL2 such that the memory cell C4 is formed in a position corresponding to the position of the bit line BL2. Specifically, the memory cell C4 and the bit line BL2 are aligned by using an alignment mark formed of a member same as that of the bit line BL2 (S7).

The memory cell C4 is formed by the cell mask B. When the memory cell C4 is formed, the alignment mark Pb1 with the memory cell C4 set as a master mark is formed together with a pattern of the memory cell C4. Further, when the memory cell C4 is formed, the solid pattern Pb2 that can cover the entire surface of the alignment mark Pa1 is formed. Consequently, the alignment mark Pb1 and the solid pattern Pb2 are formed on the substrate by using a member same as that of the memory cell C4.

After the memory cell C4 is formed by the cell mask B, an oxide film is deposited over the entire surface of the substrate and a planarization process is performed. Consequently, an interlayer insulating film (an interlayer insulating film 14 explained later) is formed in an upper layer of the memory cell C4. Thereafter, the word line WL3 in the third layer is formed on the upper layer surface of the planarized oxide film. Specifically, the word line WL3 is formed by depositing a word line material over the entire surface of the substrate and then patterning the word line material. The word line WL3 is formed on the word lines WL1 and WL2 and formed to be orthogonal to the bit lines BL1 and BL2 and joined to the memory cell C4.

When the word line WL3 is formed, the word line WL3 is aligned with the memory cell C4 such that the word line WL3 is formed in a position corresponding to the position of the memory cell C4. Specifically, the word line WL3 and the memory cell C4 are aligned by using the alignment mark Pb1 formed of a member same as that of the memory cell C4 (S8). Further, when the word line WL3 is formed, an alignment mark with the word line WL3 set as a master mark is formed of a word line material in advance together with a pattern of the word line WL3. The alignment mark is used for alignment in the next process when necessary.

Figure 6:
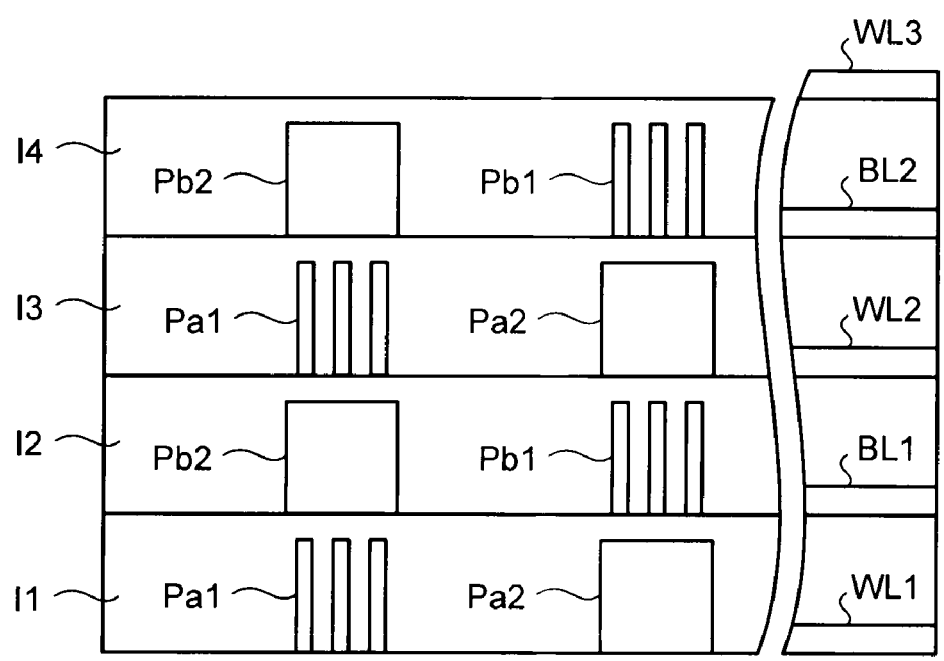
FIG. 6 is a sectional view of stacked alignment marks.

FIG. 6 is a sectional view of stacked alignment marks. In FIG. 6, a section where alignment mark groups Pax and Pbx are formed is taken along in a direction same as the direction of the sectional view of the stacked memory cell shown in FIG. 2.

The alignment mark Pa1, the solid pattern Pa2, the alignment mark Pb1, and the solid pattern Pb2 are formed on an interlayer insulating film such as an oxide film. In other words, the word lines WL1 and WL2 and the bit lines BL1 and BL2 are not formed below the alignment marks Pa1 and Pb1 and the solid patterns Pa2 and Pb2. The word lines WL1 and WL2 and the bit lines BL1 and BL2 are removed by etching.

In the stacked memory cell 1, the interlayer insulating film I1 is arranged in the upper layers of the alignment mark Pa1 and the solid pattern Pa2 formed simultaneously with the memory cell C1. The solid pattern Pb2 and the alignment mark Pb1 formed simultaneously with the memory cell C2 are arranged on the upper layer of the interlayer insulating film I1. The solid pattern Pb2 is arranged above the alignment mark Pa1. The alignment mark Pb1 is arranged above the solid pattern Pa2.

The interlayer insulating film 12 is arranged in the upper layers of the alignment mark Pb1 and the solid pattern Pb2 formed simultaneously with the memory cell C2. The solid patterns Pa2 and the alignment marks Pa1 formed simultaneously with the memory cell C3 are arranged in the upper layer of the interlayer insulating film 12. The solid pattern Pa2 is arranged above the alignment mark Pb1. The alignment mark Pa1 is arranged above the solid pattern Pb2.

The inter-layer insulating film I3 is arranged in the upper layers of the alignment mark Pa1 and the solid pattern Pa2 formed simultaneously with the memory cell C3. The solid pattern Pb2 and the alignment mark Pb1 formed simultaneously with the memory cell C4 are arranged in the upper layer of the interlayer insulating film I3. The solid pattern Pb2 is arranged above the alignment mark Pa1. The alignment mark Pb1 is arranged above the solid pattern Pa2. The inter-layer insulating film 14 is arranged in the upper layers of the alignment mark Pb1 and the solid pattern Pb2 formed simultaneously with the memory cell C4. The word line WL3 is formed on the inter-layer insulating film 14.

Figure 7A:
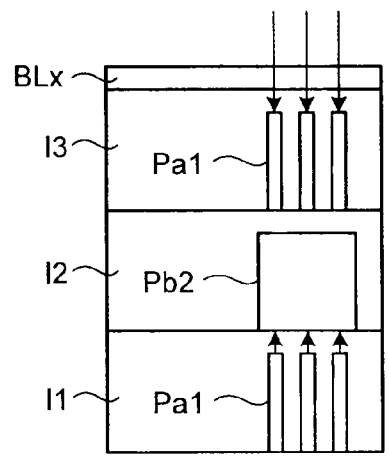
FIGS. 7A and 7B are diagrams for explaining alignment processing performed by using alignment marks.
Figure 7B:
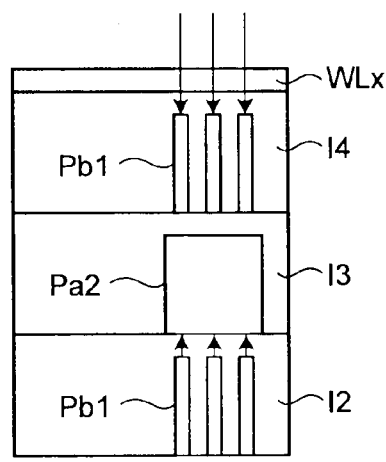

FIGS. 7A and 7B are diagrams for explaining alignment processing performed by using an alignment mark. In FIG. 7A, alignment processing in aligning the bit line BL2 in the second layer with the alignment mark of the memory cell C3 in the third layer is shown. In FIG. 7B, alignment processing in aligning the word line WL3 in the third layer with the alignment mark of the memory cell C4 in the fourth layer is shown.

When an upper layer side is aligned with a lower layer side, a position detection signal is irradiated from the upper surface side of a master pattern (an alignment pattern) formed in patterning the lower layer. The position detection signal is, for example, a laser beam. When alignment is performed, the position detection signal is irradiated on the alignment mark and reflected light from the alignment mark is detected. The position of the alignment mark is detected based on the reflected light. The lower layer and the upper layer are aligned based on the detected position.

As shown in FIG. 7A when the stacked memory cell 1 is formed, after the alignment mark Pa1 is formed together with the memory cell C3, the interlayer insulating film I3 is formed. A bit line layer BLx is stacked as a bit line material on the upper layer surface of the interlayer insulating film I3. Thereafter, to form the bit line BL2 in a position corresponding to the position of the memory cell C3, the position of the alignment mark Pa1 formed in patterning the memory cell C3 is detected.

Specifically, a position detection signal is irradiated from the upper surface side of the bit line layer BLx formed in the upper layer of the interlayer insulating film I3. The position detection signal is reflected by the alignment mark Pa1 (the alignment mark Pa1 on the upper layer side) formed in patterning the memory cell C3 and sent to the upper surface side. A part of the position detection signal is transmitted through the interlayer insulating film 12 and the interlayer insulating film I1, reflected by the alignment mark Pa1 (the alignment mark Pa1 on the lower layer side) formed in patterning the memory cell C1, and sent to the upper surface side. The position detection signal reflected by the alignment mark Pa1 on the lower layer side is blocked by the solid pattern Pb2 formed in patterning the memory cell C2 and is not sent further to the upper surface side than the interlayer insulating film I3. This makes it possible to detect only the position detection signal reflected by the alignment mark Pa1 on the upper layer side. Therefore, it is possible to prevent mutual interference of reflected lights (position detection signals) between the reflected light reflected by the alignment mark Pa1 on the upper layer side and the reflected light reflected by the alignment mark Pa1 on the lower surface side and detect only a desired signal.

On the other hand, if the alignment mark Pa1 is formed rather than the solid pattern Pb2 in patterning the memory cell C2, the position detection signal irradiated from the upper surface side of the bit line layer BLx is irregularly reflected by the various alignment marks Pa1. Specifically, the position detection signal is reflected by respective three alignment marks Pa1 formed in patterning the memory cells C1, C2, and C3.

As shown in FIG. 7B, when the stacked memory cell 1 is formed, after the alignment mark Pb1 is formed together with the memory cell C4, the interlayer insulating film 14 is formed. A word line layer WLx is stacked as a word line material on the upper layer surface of the interlayer insulating film 14. Thereafter, to form the word line WL3 in a position corresponding to the position of the memory cell C4, the position of the alignment mark Pb1 formed in patterning the memory cell C4 is detected.

Specifically, a position detection signal is irradiated from the upper surface side of the word line layer WLx formed in the upper layer of the interlayer insulating film 14. The position detection signal is reflected by the alignment mark Pb1 (the alignment mark Pb1 on the upper layer side) formed in patterning the memory cell C4 and sent to the upper surface side. A part of the position detection signal is transmitted through the interlayer insulating film I3 and the interlayer insulating film 12, reflected by the alignment mark Pb1 (the alignment mark Pb1 on the lower layer side) formed in patterning the memory cell C2, and sent to the upper surface side. The position detections signal reflected by the alignment mark Pb1 on the lower layer side is blocked by the solid pattern Pa2 formed in patterning the memory cell C3 and is not sent further to the upper surface side than the interlayer insulating film 14. This makes it possible to detect only the position detection signal reflected by the alignment mark Pb1 on the upper layer side in the position detection signal irradiated from the upper surface side of the word line layer WLx. Therefore, it is possible to prevent mutual interference of reflected lights (position detection signals) between the reflected light reflected by the alignment mark Pb1 on the upper layer side and the reflected light reflected by the alignment mark Pb1 on the lower surface side and detect only a desired signal.

On the other hand, if the alignment mark Pb1 is formed rather than the solid pattern Pa2 in patterning cell C3, the position detection signal irradiated from the upper surface side of the word line layer WLx is irregularly reflected by the various alignment marks Pb1. Specifically, the position detection signal is reflected by respective three alignment marks Pb1 formed in patterning the memory cells C2, C3, and C4.

As explained above, in this embodiment, when the memory cells C1 to C4 of the stacked memory cell 1 are formed, the alignment mark Pa1 and the solid pattern Pb2 are alternately formed and the alignment mark Pb1 and the solid pattern Pa2 are alternately formed by alternately using the cell mask A and the cell mask B. When the bit line BL2 is formed, alignment is performed by using the alignment mark Pa1. When the word line WL3 is formed, alignment is performed by using the alignment mark Pb1. Thereafter, a pattern further on the upper layer side than the stacked memory cell 1 is formed and a semiconductor device is manufactured.

In this embodiment, a pattern formed in the upper layer of the alignment mark Pa1 is the solid pattern Pb2. However, the pattern formed in the upper layer of the alignment mark Pa1 may be other patterns. In other words, the pattern formed in the upper layers Pa1 and Pb1 does not need to be a solid pattern as long as mutual interference of position detection signals can be prevented between the alignment marks Pa1 and Pb1 on the lower layer side. For example, as a pattern for preventing mutual interference of position detection signals between the alignment marks Pa1 and Pb1 on the lower layer side, slit data orthogonal to the alignment mark Pa1 and the alignment mark Pb1 can be used.

Figure 8A:
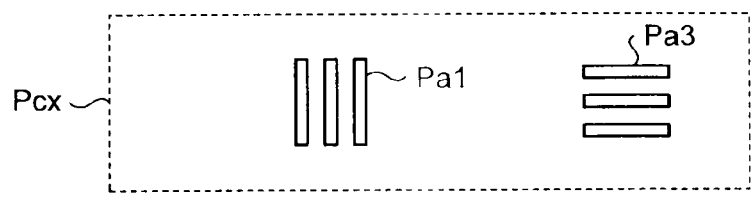
FIGS. 8A and 8B are other configuration examples of alignment marks used for forming memory cells.
Figure 8B:
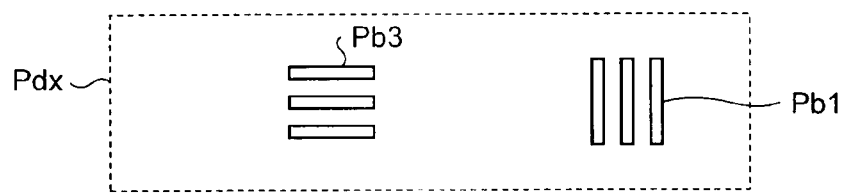

FIGS. 8A and 8B are diagrams of other configuration examples of alignment marks used for forming memory cells. In FIGS. 8A and 8B, top views of examples of alignment marks formed on a substrate and patterns for preventing mutual interference of position detection signals (hereinafter, "irregular reflection prevention pattern") are shown.

As shown in FIG. 8A, an alignment mark group Pcx includes the alignment mark Pa1 and an irregular reflection prevention pattern Pa3 used in forming the memory cells C1 and C3. As shown in FIG. 8B, an alignment mark group Pdx includes the alignment mark Pb1 and the irregular reflection prevention pattern Pb3 used in forming the memory cells C2 and C4.

The irregular reflection prevention pattern Pa3 and the irregular reflection prevention pattern Pb3 are, for example, substantially bar-like patterns including a plurality of patterns. The substantially bar-like patterns are respectively arranged in directions perpendicular to the alignment marks Pa1 and Pb1. The irregular reflection prevention patterns Pa3 and Pb3 are respectively formed in areas having sizes equal to or larger than areas in which the alignment marks Pa1 and Pb1 are formed. The irregular reflection prevention patterns Pa3 and Pb3 are, for example, patterns obtained by rotating the alignment marks Pa1 and Pb1 90 degrees in a pattern formation surface.

In this embodiment, the stacked memory cell 1 includes the memory cells C1 to c4 in the four layers. However, if a stacked memory cell includes three or more layers, the stacked memory cell can include five or more layers. Even when the stacked memory cell includes five or more layers, the memory cell is stacked by alternately using the cell mask A and the cell mask B. This makes it possible to form, with the two cell masks A and B, a cross-point memory including three or more layers.

In this embodiment, the alignment mark group Pax and the alignment mark group Pbx are formed on the interlayer insulating films I1 to I3. However, a word line material and a bit line material can be arranged between the interlayer insulating films I1 to I3 and the alignment mark groups Pax and Pbx. Interlayer insulating films having height same as that of the word lines WL1 and WL2 and the bit lines BL1 and BL2 can be arranged between the interlayer insulating film I1 to I3 and the alignment mark groups Pax and Pbx.

In this embodiment, the solid pattern Pa2 is arranged near the alignment mark Pa1. However, the solid pattern Pa2 can be arranged in a position far apart from the alignment mark Pa1. In this case, as in the embodiment, the solid pattern Pb2 and the alignment mark Pb1 are arranged in positions corresponding to the arrangements of the solid pattern Pa2 and the alignment mark Pa1.

As explained above, according to the embodiment, the cell masks A and B are formed such that a solid pattern of each of the cell masks covers an alignment mark of the other cell mask. Therefore, a position detection signal in aligning a word line and a bit line is less easily irregularly reflected. This makes it possible to form, with the two cell masks A and B, a stacked cross point memory including three or more layers. Therefore, it is possible to stack memory cells with a small number of masks.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An alignment mark formed by using a first mask used in forming a memory cell pattern on a substrate and formed together with the memory cell pattern, the alignment mark comprising:
 a first pattern for position detection used for alignment in forming a first wiring pattern; and
 a first irregular reflection prevention mark that suppresses, when a position detection signal is irradiated as alignment in forming a second wiring pattern further on an upper layer side than the first wiring pattern, irregular reflection of a position detection signal from a second pattern for position detection such that the irradiated position detection signal is not affected by the second pattern for position detection formed by a second mask different from the first mask, wherein
 the second pattern for position detection is:
 a pattern formed on a lower layer side than the first pattern for position detection using the second mask having a memory cell pattern same as that of the first mask; and
 a pattern used for alignment in forming a third wiring pattern formed on a lower layer side than the first wiring pattern.

2. The alignment mark according to claim 1, wherein the first irregular reflection prevention mark is a solid pattern that can cover an entire surface of the second pattern for position detection.

3. The alignment mark according to claim 1, wherein the first pattern for position detection includes a plurality of bar-like patterns arranged in parallel.

4. The alignment mark according to claim 3, wherein the first irregular reflection prevention mark includes a plurality of bar-like patterns arranged in a direction perpendicular to the first pattern for position detection.

5. The alignment mark according to claim 1, wherein a second irregular reflection prevention mark is formed on a lower layer side of the first pattern for position detection, the second irregular reflection prevention mark being formed by using the second mask and together with the memory cell pattern and suppressing, when a position detection signal is irradiated as alignment in forming a fourth wiring pattern further on the upper layer side than the second wiring pattern, irregular reflection of a position detection signal from the first pattern for position detection such that the irradiated position detection signal in forming the fourth wiring pattern is not affected by the first pattern for position detection.

6. The alignment mark according to claim 1, wherein third irregular reflection prevention mark is formed on an upper layer side of the first pattern for position detection, the third irregular reflection prevention mark being formed by using the first mask and together with the memory cell pattern and suppressing, when a position detection signal is irradiated as alignment in forming the third wiring pattern, irregular reflection of a position detection signal from a third pattern for position detection such that the irradiated position detection signal in forming the third wiring pattern is not affected by the third pattern for position detection formed by the first mask and used for alignment in forming a fifth wiring pattern further on the lower layer side than the third wiring pattern.

7. The alignment mark according to claim 1, wherein a fourth pattern for position detection is formed on an upper layer side of the first irregular reflection prevention mark, the fourth pattern for position detection being formed by using the second mask and together with the memory cell pattern and used for alignment in forming the second wiring pattern.

8. The alignment mark according to claim 1, wherein an interlayer insulating film is formed between the second pattern for position detection and the first irregular reflection prevention mark.

9. The alignment mark according to claim 1, wherein the third wiring pattern is formed between the second pattern for position detection and the first irregular reflection prevention mark.

10. A mask set comprising first and second masks used in forming a same memory cell pattern on a substrate, wherein the first mask includes:
   a first mask pattern that forms, on the substrate, a first pattern for position detection used for alignment in forming a first wiring pattern; and
   a first irregular reflection prevention mark that suppresses, when a position detection signal is irradiated as alignment in forming a second wiring pattern further on an upper layer side than the first wiring pattern, irregular reflection of a position detection signal from a second pattern for position detection such that the irradiated position detection signal is not affected by the second pattern for position detection formed by a second mask and used for alignment in forming a third wiring pattern further on a lower layer side than the first wiring pattern, and the second mask includes:
   a second mask pattern that forms the second pattern for position detection; and
   a second irregular reflection prevention mark that suppresses, when a position detection signal is irradiated as alignment in forming a fourth wiring pattern further on the upper layer side than the second wiring pattern using the first mask, irregular reflection of a position detection signal from the first pattern for position detection such that the irradiated position detection signal in forming the fourth wiring pattern is not affected by the first pattern for position detection formed by the first mask and used for alignment in forming the first wiring pattern.

11. The mask set according to claim 10, wherein the first irregular reflection prevention mark is a solid pattern that can cover an entire surface of the second pattern for position detection.

12. The mask set according to claim 10, wherein the first pattern for position detection includes a plurality of bar-like patterns arranged in parallel.

13. The mask set according to claim 12, wherein the first irregular reflection prevention mark includes a plurality of bar-like patterns arranged in a direction perpendicular to the first pattern for position detection.

* * * * *